United States Patent
Nalla et al.

(10) Patent No.: US 8,425,785 B2
(45) Date of Patent: Apr. 23, 2013

(54) MECHANICAL ADHESION OF COPPER METALLIZATION TO DIELECTRIC WITH PARTIALLY CURED EPOXY FILLERS

(75) Inventors: Ravi Nalla, Chandler, AZ (US); Omar Bchir, Phoenix, AZ (US); Houssain Jomas, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1127 days.

(21) Appl. No.: 12/059,031

(22) Filed: Mar. 31, 2008

(65) Prior Publication Data

US 2009/0242109 A1    Oct. 1, 2009

(51) Int. Cl.
    B32B 38/04    (2006.01)
    B32B 5/16     (2006.01)
    B32B 7/12     (2006.01)

(52) U.S. Cl.
    USPC ........... 216/17; 216/39; 156/250; 428/327

(58) Field of Classification Search .......... None
    See application file for complete search history.

(56) References Cited

U.S. PATENT DOCUMENTS

| | | | | |
|---|---|---|---|---|
| 4,120,913 A | * | 10/1978 | Petrie | 525/524 |
| 4,752,499 A | * | 6/1988 | Enomoto | 427/97.2 |
| 4,824,616 A | * | 4/1989 | Shimizu et al. | 264/7 |
| 5,021,472 A | * | 6/1991 | Enomoto | 523/427 |
| 5,055,321 A | * | 10/1991 | Enomoto et al. | 427/97.2 |
| 5,106,918 A | * | 4/1992 | Karasz et al. | 525/233 |
| 5,231,150 A | * | 7/1993 | McGrail et al. | 525/503 |
| 5,519,177 A | * | 5/1996 | Wang et al. | 174/259 |
| 5,872,067 A | * | 2/1999 | Meng et al. | 442/387 |
| 6,010,768 A | * | 1/2000 | Yasue et al. | 428/209 |
| 6,124,408 A | * | 9/2000 | Wang et al. | 525/523 |
| 6,217,988 B1 | * | 4/2001 | Yasue et al. | 428/209 |
| 6,251,502 B1 | * | 6/2001 | Yasue et al. | 428/209 |
| 6,265,498 B1 | * | 7/2001 | Wang et al. | 525/523 |
| 6,294,621 B1 | * | 9/2001 | Wang et al. | 525/523 |
| 6,306,980 B1 | * | 10/2001 | Wang et al. | 525/523 |
| 6,451,932 B1 | * | 9/2002 | Wang et al. | 525/523 |
| 6,579,588 B2 | * | 6/2003 | Waid | 428/41.8 |
| 6,607,825 B1 | * | 8/2003 | Wang et al. | 428/343 |
| 6,866,919 B2 | * | 3/2005 | Ikeguchi et al. | 428/209 |
| 6,913,792 B2 | * | 7/2005 | Clough et al. | 427/386 |
| 8,088,245 B2 | * | 1/2012 | Lutz et al. | 156/325 |
| 2003/0162006 A1 | * | 8/2003 | Ikeguchi et al. | 428/220 |
| 2004/0202862 A1 | * | 10/2004 | Kazmaier et al. | 428/403 |
| 2005/0022929 A1 | * | 2/2005 | Schoenfeld et al. | 156/272.2 |
| 2007/0251721 A1 | * | 11/2007 | Kiuchi et al. | 174/258 |
| 2008/0188609 A1 | * | 8/2008 | Agarwal et al. | 524/504 |
| 2010/0201802 A1 | * | 8/2010 | Onishi et al. | 348/87 |
| 2010/0221511 A1 | * | 9/2010 | Benson et al. | 428/212 |

* cited by examiner

*Primary Examiner* — Allan Olsen

(74) *Attorney, Agent, or Firm* — Schwegman, Lundberg & Woessner, P.A.

(57) ABSTRACT

In some embodiments, an improved mechanical adhesion of copper metallization to dielectric with partially cured epoxy fillers is presented. In this regard, a substrate build-up film is introduced having epoxy material and a plurality of epoxy microspheres, wherein an interior of the microspheres is not fully cured. Other embodiments are also disclosed and claimed.

10 Claims, 2 Drawing Sheets

MECHANICAL ADHESION OF COPPER METALLIZATION TO DIELECTRIC WITH PARTIALLY CURED EPOXY FILLERS

FIELD OF THE INVENTION

Embodiments of the present invention generally relate to the field of integrated circuit packages, and, more particularly to improved mechanical adhesion of copper metallization to dielectric with partially cured epoxy fillers.

BACKGROUND OF THE INVENTION

The demand for enhanced performance and functionality of integrated circuit components continues to increase design and fabrication complexity. The substrates designed for these components will need to be manufactured with multiple layers of copper on dielectric material. The width of copper traces is continually shrinking making adhesion of copper to dielectric more difficult. One method commonly used to promote adhesion of copper to dielectric build-up material is desmear. Desmear typically involves treating an organic substrate surface with a sweller to infiltrate polymer free volume and prepare the surface for oxidation, an oxidizing agent such as permanganate or chromate to promote micro roughness by oxidizing polar species on the surface and near the surface of the dielectric, and a neutralizer to remove any reaction by-products or solvents from the previous steps and de-swell the matrix. However, higher average roughness alone will not necessarily result in better adhesion or higher peel strength. Adhesion is strongly dependent on the surface profile formed on the surface after desmear.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
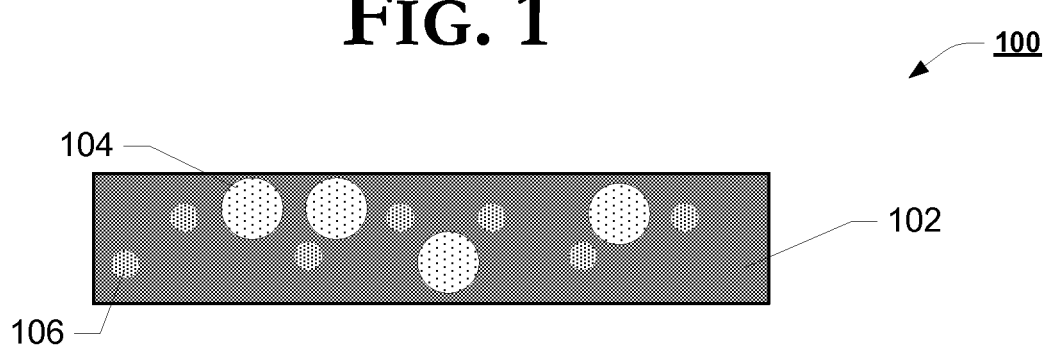
FIG. 1 is a graphical illustration of a cross-sectional view of a build-up film, in accordance with one example embodiment of the invention.

FIG. 1 is a graphical illustration of a cross-sectional view of a build-up film, in accordance with one example embodiment of the invention. In accordance with the illustrated example embodiment, build-up film 100 includes one or more of dielectric material 102, epoxy microspheres 104 and filler 106.

Dielectric material 102 represents an organic dielectric material, such as epoxy based dielectric. In one embodiment, dielectric material 102 is at least partially cured. In another embodiment, dielectric material 102 is uncured until being laminated onto a package substrate. As such, while shown as having a shape in FIG. 1, build-up film 100 may be fluid until further processing steps.

Epoxy microspheres 104 represent partially cured epoxy filler spheres wherein an interior of the microspheres in not fully cured. In one embodiment, epoxy microspheres 104 are formed by jetting uncured epoxy into a jetting tower that partially cures the exterior of the epoxy microspheres 104 while leaving the interior of epoxy microspheres 104 uncured. In another embodiment, the interior of epoxy microspheres 104 is partially cured. The exterior of epoxy microspheres 104 may be partially or fully cured. In one embodiment, epoxy microspheres 104 have a diameter of from about 1 to about 2 micrometers. In one embodiment, epoxy microspheres 104 have a concentration within build-up film 100 of from about 3 to about 5 volume percent.

Filler 106 may represent silica spheres, such as $SiO_2$, which may decrease the coefficient of thermal expansion of build-up film 100.

Figure 2:
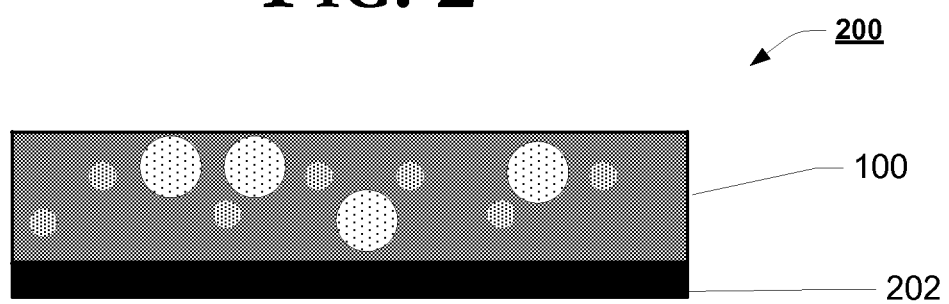
FIG. 2 is a graphical illustration of a cross-sectional view of a partially formed IC package substrate, in accordance with one example embodiment of the invention.

FIG. 2 is a graphical illustration of a cross-sectional view of a partially formed IC package substrate, in accordance with one example embodiment of the invention. As shown, package substrate 200 includes one or more of build-up film 100 coupled with metallization layer 202.

Metallization layer 202 may represent a substrate's metal layer on a core epoxy material or a plated conductive layer. In one embodiment, build-up film 100 is laminated on metallization layer 202 after adhesion promoter treatment of the Cu, and then cured. In another embodiment, build-up film 100 is not fully cured until after further processing. The exterior of epoxy microspheres 104 is substantially non-thermally conductive and should minimize further curing of the interior of epoxy microspheres 104.

Figure 3:
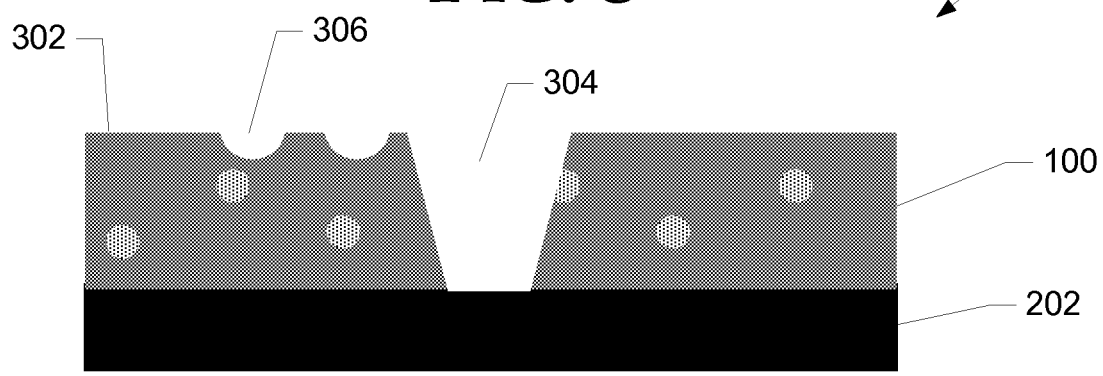
FIG. 3 is a graphical illustration of a cross-sectional view of a partially formed IC package substrate, in accordance with one example embodiment of the invention.

FIG. 3 is a graphical illustration of a cross-sectional view of a partially formed IC package substrate, in accordance with one example embodiment of the invention. As shown, package substrate 300 includes one or more of build-up film 100, metallization layer 202, build-up film surface 302, via opening 304 and microsphere cavities 306.

Via opening 304 may be formed in build-up film 100 by laser drilling from build-up film surface 302 to expose portions of metallization layer 202. Via openings may also be formed by punching or mechanical drilling. Next, desmear is performed on build-up film surface 302 and the walls of via opening 304 to promote roughness and remove any smear residue from the via opening process. On areas in build-up film 100 which consist of dielectric material 102, a regular roughness profile would emerge. However, due to the presence of epoxy microspheres 104, their subjection to swelling and microetch in desmear will provide a faster etch rate at these specific locations as compared to dielectric material 102 due to the fact that they have undergone less curing than the bulk of the film. In one embodiment, the microetch, for example potassium permanganate, will preferentially attack and remove the interiors of exposed epoxy microspheres 104, creating microsphere cavities 306. In one embodiment, from about 3 to about 4 micrometers of build-up film 100 is etched off. One skilled in the art would appreciate that the topology of the surface can be tuned and well controlled to create the roughness profile desired, for example with low average roughness (Ra) but high roughness depth (Rz), due to pores which extend into the matrix based on the size and concentration of the epoxy microspheres 104.

Figure 4:
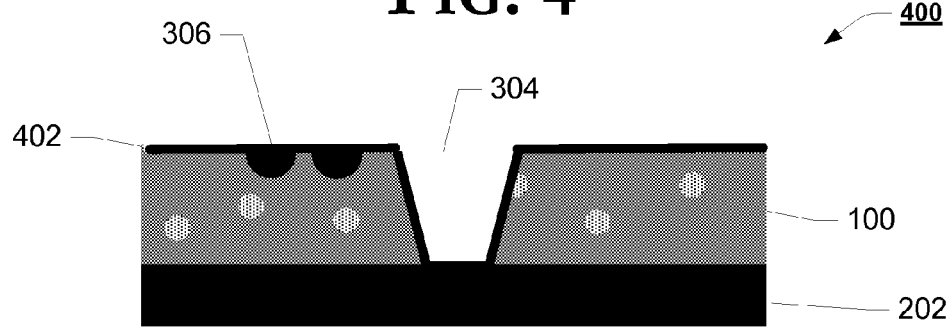
FIG. 4 is a graphical illustration of a cross-sectional view of a partially formed IC package substrate, in accordance with one example embodiment of the invention.

FIG. 4 is a graphical illustration of a cross-sectional view of a partially formed IC package substrate, in accordance with one example embodiment of the invention. As shown, package substrate 400 (only partially shown here) includes one or more of build-up film 100, metallization layer 202, via opening 304, microsphere cavities 306, and copper plating layer 402.

Copper plating layer 402 represents copper that has adhered to build-up film 100 (and exposed metallization layer 202), plating via opening 304 and filling microsphere cavities 306 through electro-less and electrolytic plating [note that standard electroless plating thickness is ≦0.8 um, hence may not be able to fill a 2 um void formed by epoxy microsphere etch]. In one embodiment, electroless copper plating layer 402 forms a seed layer for a subsequent metallization layer, which can be deposited by electrolytic Cu plating. One skilled in the art would recognize that copper plating in microsphere cavities 306 creates deep anchors that should yield improved mechanical adhesion between copper plating layer 402 and build-up film 100 and therefore higher peel strength.

In one embodiment, package substrate 400 is coupled with an integrated circuit die such as a flip chip silicon die to form an integrated circuit package. In another embodiment, additional build-up and/or metallization layers are formed on package substrate 400 as part of a continued build-up process.

Figure 5:
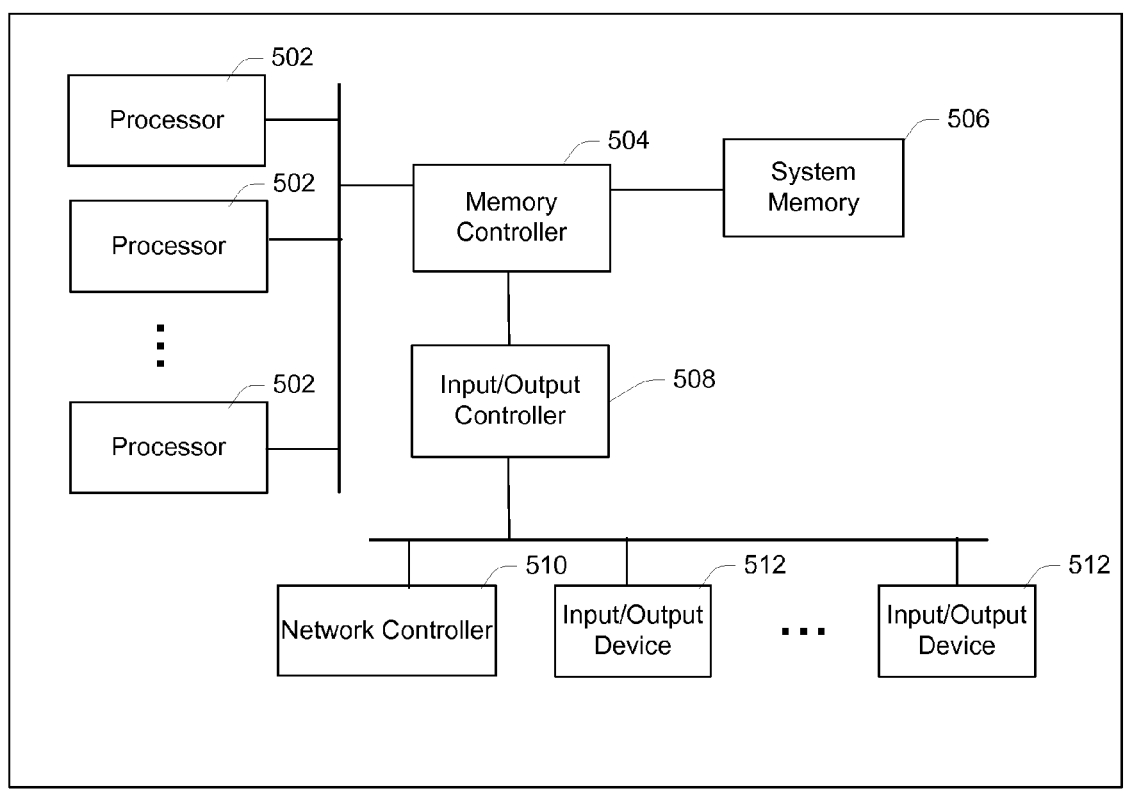
FIG. 5 is a block diagram of an example electronic appliance suitable for implementing an IC package substrate with conductor structure on dielectric material, in accordance with one example embodiment of the invention.

FIG. 5 is a block diagram of an example electronic appliance suitable for implementing an IC package substrate with improved mechanical adhesion of copper metallization to dielectric, in accordance with one example embodiment of the invention. Electronic appliance 500 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 500 may include one or more of processor(s) 502, memory controller 504, system memory 506, input/output controller 508, network controller 510, and input/output device(s) 512 coupled as shown in FIG. 5. Processor(s) 502, or other integrated circuit components of electronic appliance 500, may be housed in a package including a substrate described previously as an embodiment of the present invention.

Processor(s) 502 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 502 are Intel® compatible processors. Processor(s) 502 may have an instruction set containing a plurality of machine level instructions that may be invoked, for example by an application or operating system.

Memory controller 504 may represent any type of chipset or control logic that interfaces system memory 508 with the other components of electronic appliance 500. In one embodiment, the connection between processor(s) 502 and memory controller 504 may be referred to as a front-side bus. In another embodiment, memory controller 504 may be coupled with processor(s) 502 through a point-to-point serial interface.

System memory 506 may represent any type of memory device(s) used to store data and instructions that may have been or will be used by processor(s) 502. Typically, though the invention is not limited in this respect, system memory 506 will consist of dynamic random access memory (DRAM). In one embodiment, system memory 506 may consist of Rambus DRAM (RDRAM). In another embodiment, system memory 506 may consist of double data rate synchronous DRAM (DDRSDRAM).

Input/output (I/O) controller 508 may represent any type of chipset or control logic that interfaces I/O device(s) 512 with the other components of electronic appliance 500. In one embodiment, I/O controller 508 may be referred to as a south bridge. In another embodiment, I/O controller 508 may comply with the Peripheral Component Interconnect (PCI) Express™ Base Specification, Revision 1.0a, PCI Special Interest Group, released Apr. 15, 2003.

Network controller 510 may represent any type of device that allows electronic appliance 500 to communicate with other electronic appliances or devices. In one embodiment, network controller 510 may comply with a The Institute of Electrical and Electronics Engineers, Inc. (IEEE) 802.11b standard (approved Sep. 16, 1999, supplement to ANSI/IEEE Standard 802.11, 1999 Edition). In another embodiment, network controller 510 may be an Ethernet network interface card.

Input/output (I/O) device(s) 512 may represent any type of device, peripheral or component that provides input to or processes output from electronic appliance 500.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method comprising:

laminating a build-up film to a metallization layer of a substrate, wherein the build-up film includes epoxy micro spheres at least partially embedded within a separate matrix, wherein the micro spheres include an interior that is substantially uncured, and an exterior formed from the same material as the interior, is more cured than the interior; and forming vias through a top surface of the build-up film to expose portions of the metallization layer.

2. The method of claim 1, further comprising performing desmear on the top surface of the build-up film to etch off a portion of the build-up film and to remove the interior of exposed micro spheres.

3. The method of claim 2, further comprising performing electroless plating on the top surface of the build-up film to form a seed layer for a subsequent metallization layer.

4. The method of claim 3, further comprising forming additional build-up and metallization layers to form an integrated circuit package substrate.

5. The method of claim 4, further comprising coupling an integrated circuit device with the substrate to form an integrated circuit package.

6. The method of claim 5, further comprising integrating the integrated circuit package into an electronic appliance.

7. A method comprising:
   laminating a build-up film to a metallization layer of a substrate, wherein the build-up film includes epoxy micro spheres at a concentration of from about 3 to about 5 volume percent, wherein the micro spheres include an interior that is substantially uncured;
   forming vias through a top surface of the build-up film to expose portions of the metallization layer;
   performing desmear on the top surface of the build-up film to etch off a portion of the build-up film and to remove the interior of exposed micro spheres; and
   performing electroless plating on the top surface of the build-up film to form a seed layer for a subsequent metallization layer.

8. The method of claim 7, wherein the micro spheres comprise a diameter of from about 1 to about 2 micrometers.

9. The method of claim 7, wherein performing desmear comprises exposing the build-up film to potassium permanganate.

10. The method of claim 7, wherein to etch off a portion of the build-up film comprises to etch off from about 3 to about 4 micrometers of the build-up film.

* * * * *